United States Patent [19]
Sasaki

[11] 3,932,866
[45] Jan. 13, 1976

[54] COMPUTER KEYBOARD CIRCUITRY
[75] Inventor: Hiroshi Sasaki, Irvine, Calif.
[73] Assignee: Ricoh Electronics, Inc., Irvine, Calif.
[22] Filed: July 24, 1974
[21] Appl. No.: 491,446

[52] U.S. Cl. ............................ 340/365 E; 340/365 R
[51] Int. Cl.² ............................................. G08C 1/00
[58] Field of Search ...................... 340/365 E, 365 R

[56] References Cited
UNITED STATES PATENTS

| | | | |
|---|---|---|---|
| 2,716,230 | 8/1955 | Oliwa | 340/365 E |
| 2,718,633 | 9/1955 | Fennessy | 340/365 E |
| 3,454,147 | 7/1969 | Schrem | 340/365 E |
| 3,471,789 | 10/1969 | Nutting | 340/365 E |

Primary Examiner—Thomas B. Habecker
Attorney, Agent, or Firm—Wills, Green & Mueth

[57] ABSTRACT

A computer keyboard circuit for preventing development of fallacious signals by bouncing or chattering of the keyboard switch contacts, which circuit includes means for delivering a proper output signal to one of several output lines in response to actuation of one of the keyboard switches from a first normal condition to a predetermined actuated condition, and operable to then prevent delivery of an additional output signal to any of the output lines until complete return of the switch to its normal position. To achieve this result, each keyboard switch has two contacts responsive to actuation of the switch to its two different conditions respectively, and the circuitry requires that the switch return the entire distance from one contact to the other in order to condition the apparatus for production of a second output signal.

14 Claims, 3 Drawing Figures

COMPUTER KEYBOARD CIRCUITRY

BACKGROUND OF THE INVENTION

This invention relates to improved circuitry for producing computer controlling signals in response to the actuation of the different keys of a keyboard, as for instance in small electronic desk calculators and the like.

In certain types of computer keyboard arrangements, it is conventional to utilize an X-Y array of key controlled switches, each adapted to feed into the computer or calculator a signal representing a particular number or other element of data, or to deliver a predetermined command for commencing a desired arithmetical operation or the like. Two sets of intersecting input and output lines are connected to the switches, with each line having associated with it a series of such switches, and with each switch serving to connect one of the input lines to a predetermined one of the output lines. A series of timed pulses are supplied to each of the input lines, for ultimate delivery through the various output lines to the other circuitry of the computer when different ones of the switches are closed. An additional circuit, preferably including a flip flop and shift register, acts upon closure of any of the switches to produce a "Start" signal, which is utilized in reading and interpreting the output pulses.

One major difficulty which has been encountered with this type of keyboard circuitry has resided in its susceptibility to formation of spurious start signals as a result of chattering or bouncing of the switch contacts during actuation. It is extremely difficult for an operator to always press and release all keys with a sufficiently uniform, positive and rapid motion to assure only a single uninterrupted closure of the switch upon each actuation. If a switch in a conventional keyboard circuit first closes, then opens for a short interval, and then closes again, all during a single actuation of the switch, the circuit may produce two separate start signals, resulting in the delivery of incorrect data or an incorrect command to the remainder of the computer.

SUMMARY OF THE INVENTION

The present invention overcomes the above disadvantage of prior keyboard circuits by providing an arrangement in which spurious signals can not be produced even though the switches may be subject to chattering or bouncing and may conduct only intermittently during a single actuation of the switch. This result is achieved in part by forming each of the switches to have first contact means responsive to positioning of the switch in a first and normal condition thereof, and second contact means responsive to actuation of the switch to a second condition. When the switch is actuated to its second condition, the second contact means cause delivery of an output signal to one of several output lines from the keyboard assembly. The circuit is so designed, however, that this actuated switch can not then produce another output signal, even though there may be some chattering of the "second contact means", and unless and until the switch is returned fully to its normal condition in which the "first contact means" are again actuated. These first contact means thus serve as conditioning elements whose actuation is required in order to enable the switch to deliver a next successive output signal.

The circuitry for accomplishing this result desirably includes a two stable state unit, such as flip-flop, which is adapted to be set to a condition for producing an output signal in response to actuation of a particular switch from one condition to the other, and which is adapted to be reset for producing a next successive signal only in response to complete return of the switch to its normal setting. A number of such flip-flops should be provided for controlling the delivery of output signals to a series of different output lines respectively, with the different flip-flops being controlled by different groups of the manually actuable switches. A delay unit may respond to actuation of any of the flip-flops to its signal producing condition to automatically terminate a signal pulse produced by the flip-flop upon expiration of a predetermined timed interval following such actuation.

As in the prior art arrangements discussed above, a series of input lines leading to different sets of the keyboard switches carry timed input pulses which pass through the switches when they are actuated. In addition to these input lines, another line may be provided to which pulses are supplied at a frequency corresponding to pulses in the mentioned input lines, but out of phase with respect to those pulses, for use in conjunction with the input line pulses in controlling the setting and resetting of the flip-flops.

BRIEF DISCRIPTION OF THE DRAWINGS.

The above and other features and objects of the invention will be better understood from the following detailed description of the typical embodiment illustrated in the accompanying drawings, in which.

DESCRIPTION OF THE PREFERRED EMBODIMENT

Figure 1:
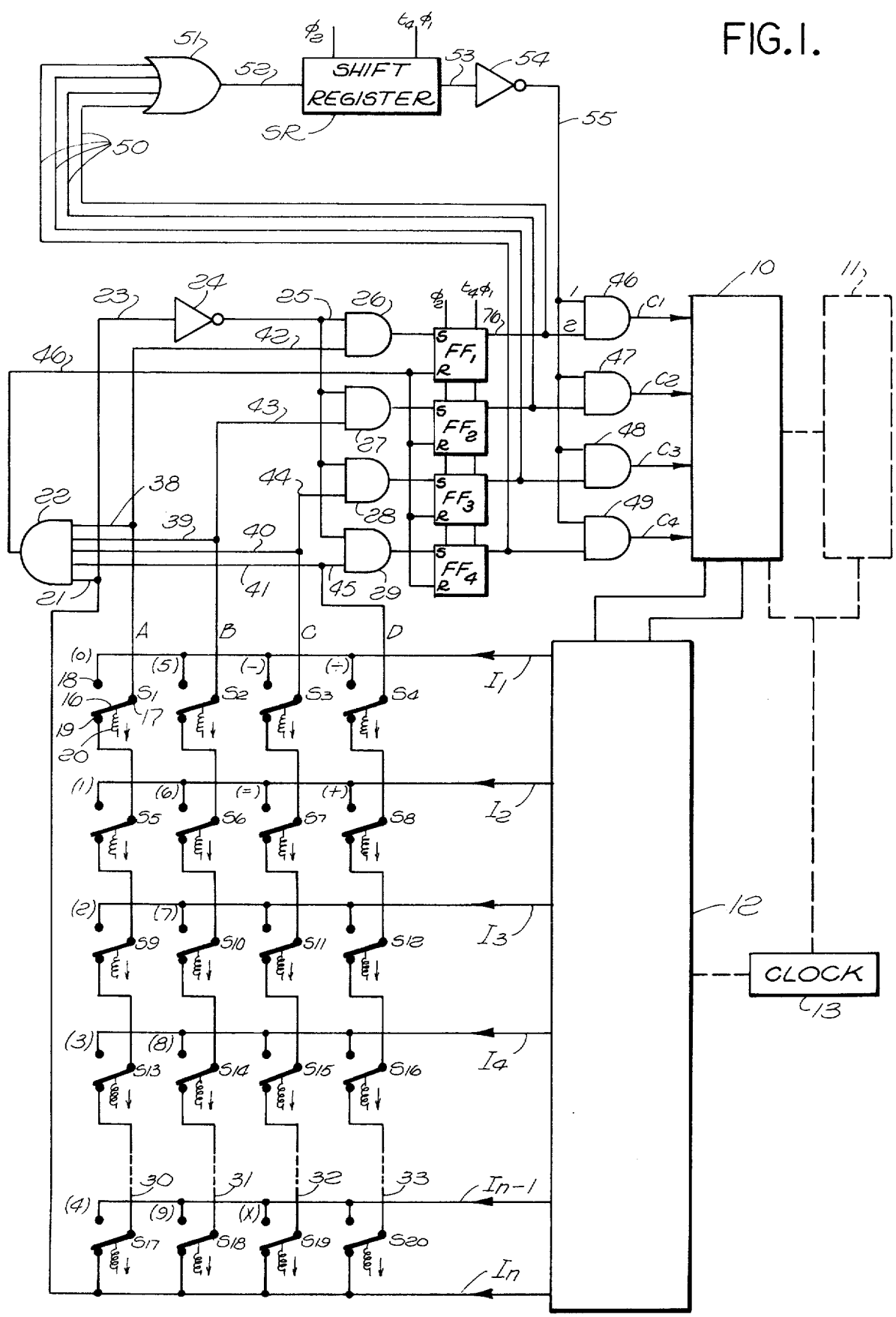
FIG. 1 shows a preferred computer keyboard circuit embodying the invention.

The electronic computer or calculator keyboard circuitry illustrated in FIG. 1 includes an X-Y array of switches $S_1$, $S_2$, $S_3$, etc., each serving upon actuation to deliver to the input section 10 of the computer or calculator a signal representing a particular element of data, or a particular command for performance of a calculating operation or the like by the computer. For example, the left hand column of switches $S_1$, $S_5$, $S_9$, $S_{13}$ and $S_{17}$ may represent the digits 0, 1, 2, 3, and 4, as indicated; while the second column of switches $S_2$, $S_6$, etc. may represent the digits 5, 6, 7, 8 and 9 respectively. Switch $S_3$ may represent a decimal point, while others of the switches may when actuated give commands for arithmetical addition, subtraction, multiplication and division operations, or commands to add a number to the memory, subtract it from the memory, or the like. These signals are interpreted by input circuit 10, which may encode any numbers received in BCD form, and deliver them along with the commands or separately from the commands, to the remainder of the computer circuitry represented diagrammatically at 11 in FIG. 1.

Input pulses are delivered to the various switches through a series of input lines designated $I_1$, $I_2$, $I_3$, $I_4$ $I_{n-1}$, and $I_n$. These pulses may be delivered to the input lines from an appropriate source represented at 12, under control of a clock which is designated generally at 13 and acts to control the operation of all portions of the computer in synchronism. The pulses which are delivered to the circuitry through line $I_1$ are represented at 14a in the time charts of FIGS. 2 and 3. As illustrated, these pulses may be direct current pulses occurring at a predetermined uniform relatively high frequency, with the intervals between pulses being several times as long as the duration in time of the pulses themselves.

Figure 2:
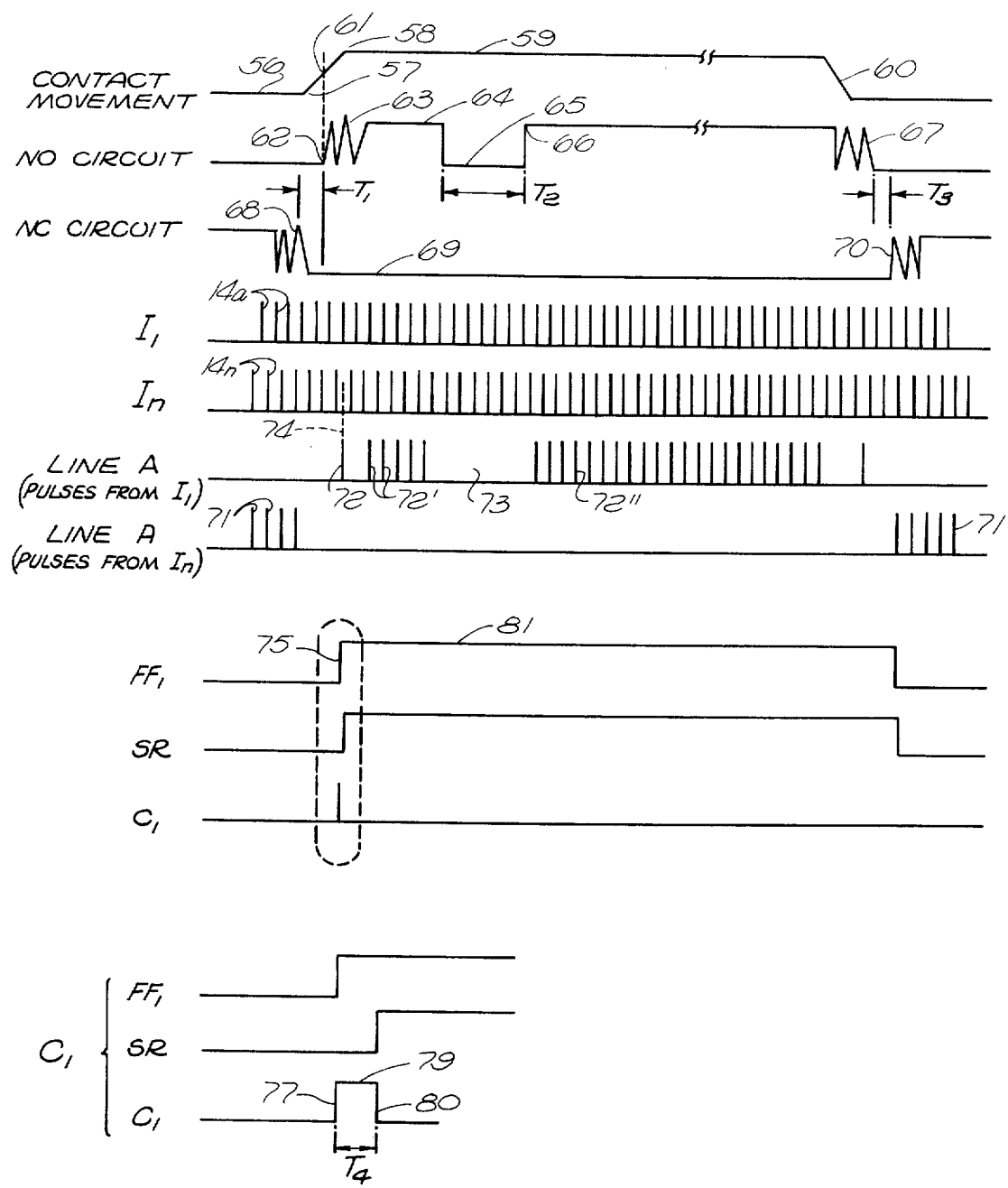
FIG. 2 is a timing chart for the FIG. 1 circuit.
Figure 3:
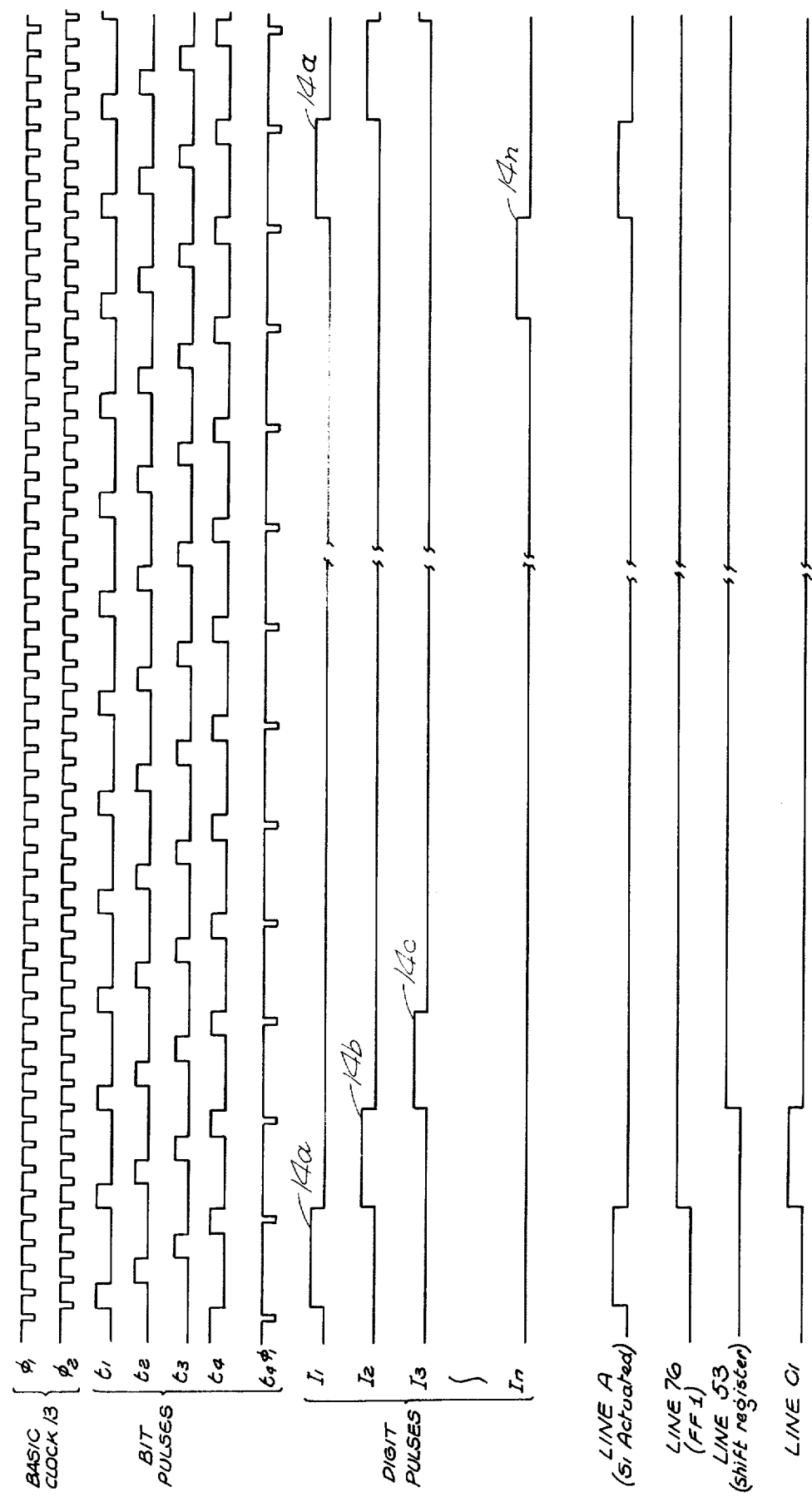
FIG. 3 is another timing chart of the FIG. 1 circuit on an expanded time scale.

The streams of pulses delivered to the circuitry through input lines $I_2$, $I_3$, $I_4$ etc. through $I_n$ may be identical with and of the same frequency as the discussed pulses 14a on line $I_1$, but staggered in time with respect to pulses 14a, and with respect to one another, in the progressive scanning relation illustrated in the expanded time chart of FIG. 3. Thus, on each cycle of input pulses, a pulse 14b on line $I_2$ commences at the same time that pulse 14a on line $I_1$ terminates, a pulse 14c on line $I_3$ commences as pulse 14b terminates, etc., until finally as pulse 14n on line $I_n$ terminates, another cycle commences with a next successive pulse 14a on line $I_1$. In the reduced scale time chart of FIG. 2, the out-of-phase relationship of pulses 14n with respect to pulses 14a has been exagerated, to facilitate an understanding of the operation of the circuit.

The upper portion of FIG. 3 illustrates the manner in which the clock 13 may develop the various pulses 14a, 14b, 14c, etc. Specifically, clock 13 may produce two basic out-of-phase high frequency timing signals $\phi_1$ and $\phi_2$, with the latter being utilized in circuit 12 to produce and control four staggered pulse streams $t_1$, $t_2$, $t_3$ and $t_4$, and from $t_4$ and $\phi_1$ an additional lower frequency signal designated $t_4 \phi_1$ in FIG. 3. The signal $t_4$ may be used to commence and terminate the various pulses 14a, 14b, 14c, etc., as will be apparent from FIG. 3.

Each of the switches $S_1$, $S_2$, $S_3$, etc. is actuable between two different conditions, and has different contacts responsive to arrival of the switch at those two conditions. Preferably, the switches are actuable manually by a conventional key or push button type actuator, whose depression may be resisted yeildingly by an appropriate spring, to normally maintain each key and switch element in a predetermined one of its two conditions.

In the FIG. 1 circuit, these spring returned double throw switches are represented diagrammatically as each including a movable electrical contact 16 swinging upwardly and downwardly about a point 17 between positions of engagement with an upper normally open stationary contact 18 and a lower normally closed stationary contact 19. The return springs are represented diagrammatically at 20 in FIG. 1, and yieldingly retain the movable contacts 16 in engagement with normally closed contacts 19. Depression of a particular key on the keyboard acts to swing the movable contact 16 of the corresponding switch upwardly against the tendency of the associated spring 20 to break its engagement with lower contact 19 and move it into engagement with upper contact 18. The switches have in effect been illustrated in inverted from in FIG. 1, with their movable contacts shown as normally urged downwardly rather than upwardly, to simplify the diagrammatic showing of the circuitry of that figure.

Input line $I_1$ is connected with the upper normally open contacts of all of the switches in the top row of the X-Y array, typically including four switches in the illustrated arrangement. Similarly, input line $I_2$ is connected to the stationary upper contacts of all of the switches in the second row, and each of the other input lines except the final or lower line $I_n$ is correspondingly connected to the upper contacts of all of the switches in one associated row. The final line $I_n$ is connected to all of the lower normally closed contacts of the bottom row of switches ($S_{17}$, $S_{18}$, $S_{19}$ and $S_{20}$ in the illustrated arrangement), and also is connected at 21 to one of the multiple inputs of an AND circuit 22. This line $I_n$ is also connected through a line 23 to the input of an inverter 24, whose output is delivered through lines 25 to the input side of a series of AND gates 26, 27, 28 and 29. The movable contact of each of the bottom switches $S_{17}$, $S_{18}$, etc. is connected through a line 30, 31, 32 or 33 to the lower normally closed stationary contact 19 of the next switch above. Similarly, the movable contact of that switch which is next above is connected through a line 34, 35, 36 or 37 to the lower normally closed stationary contact of the next successive switch in the same vertical column, etc. The movable contact in the upper switch of each vertical column (switches $S_1$, $S_2$, $S_3$ and $S_4$) is connected to a line A, B, C or D, which in turn is connected to an associated one of the several inputs 38, 39, 40 or 41 of AND circuit 22. The lines A, B, C, and D are also connected to second inputs 42, 43, 44 and 45 of the AND gates 26 through 29 respectively.

The outputs of AND gates 26 through 29 are connected to the "set" inputs of four flip-flops $FF_1$, $FF_2$, $FF_3$ and $FF_4$, respectively. The reset inputs to these flip-flops are all connected in parallel to and energized by the output 46 of the previously mentioned AND circuit 22. The output lines from the four flip-flops are connected as inputs to four additional AND gates 46, 47, 48 and 49, whose outputs are delivered through lines $C_1$, $C_2$, $C_3$ and $C_4$ to circuit 10 of the computer.

The outputs from flip-flops $FF_1$, $FF_2$, $FF_3$, and $FF_4$, are also connected through four lines 50 to the input side of an OR gate 51, whose output is delivered at 52 to a shift register SR, which like flip-flops $FF_1$, $FF_2$, $FF_3$, and $FF_4$, is timed in synchronism with the other pulses by clock 13, and acts to shift a pulse in input line 52 progressively through the shift register for ultimate delivery onto output line 53 in times delayed relation to the input. This signal in line 53 is then reversed by an inverter 54, whose output is connected through line 55 to the second inputs of all of the AND circuits 46, 47, 48 and 49.

To now describe a cycle of operation of the apparatus of FIG. 1, assume that the circuitry is energized and that timed staggered input pulses as represented at 14a, 14b, 14c, 14d, etc. through 14n in FIG. 3 are being supplied on input lines $I_1$, $I_2$, $I_3$, $I_4$, etc. through $I_n$. Also, assume that all of the switches $S_1$, $S_2$, etc. are initially in their normal lower positions, as illustrated.

If an operator then actuates one of the switches, say for example switch $S_1$, to swing its movable contact upwardly from engagement with the normally closed contact 19 to engagement with the upper normally open contact 18, the physical motion of the movable contact may be considered as represented by the curve 56 in the first line of FIG. 2. More particularly, the upward movement of contact 16 may be considered as commencing at the point 57, and progressing linearly to the point 58, until the curve reaches the level 59 representing the position in which the normally open contact is closed. The reversal of this motion is represented at 60 in the same curve.

The second line of the time chart in FIG. 2 represents the condition of the normally open circuit through upper contact 18 during the discussed actuation of the switch. Specifically, when the movable contact reaches a particular point 61 in its upward movement, the movable contact 16 may initially engage upper stationary contact 18, as represented at 62 in FIG. 2. Some chattering or bouncing may cause the circuit to close and open several times just after initial contact, as represented at 63 in FIG. 2, with ultimate full closure as represented at 64. Frequently, additional chattering or bouncing may cause opening of the circuit for an interval even after the full closure level 64 has been reached, with one such interruption of the circuit being represented at 65 in FIG. 2, and continuing for the interval $T_2$ before subsequent reclosure at 66. When the switch is finally purposely returned to its normal condition, additional chattering or bouncing at 67 occurs while the movable contact is moving out of engagement with the upper contact 18.

The third line in the time chart of FIG. 2 illustrates that just prior to substantial movement of contact 16 away from the normally closed stationary contact 19, there may be intermittent making and breaking of the circuit as illustrated at 68, followed by full opening at 69, and ultimately some chattering or bouncing at 70 when the normally closed contacts are again engaged. However, it is specifically noted in FIG. 2 that there is a substantial time interval $T_1$, during which the movable contact is in engagement with neither of the two stationary contacts 18 or 19. A similar interval $T_3$ occurs upon return of the switch to its normal condition, at the other end of the curves. Further, it is noted that when the interruption in the circuit through upper contact 18 occurs at 65 in FIG. 2, the movable contact 16 does not move far enough to engage the normally closed contact 19, and consequently there is no corresponding rise or change in the normally closed circuit during interval $T_2$.

Prior to movement of contact 16 out of engagement with contact 19, the pulses from input line $I_n$ are delivered through all of the serially connected normally closed contacts of the various switches and through line 21, to simultaneously energize all of the inputs to AND gate 22, and thereby maintain all of the flip-flops $FF_1$, $FF_2$, $FF_3$ and $FF_4$ in their reset condition. The pulses in line A, for example, at this time are represented at 71 in FIG. 2, and may continue up to the time that the switch contacts move completely out of engagement. During all or part of the interval $T_1$, no pulses are supplied to the line A, until after the expiration of time $T_1$ some of the pulses 14 from line $I_1$ are conducted through switch $S_1$ to line A as represented at 72 in FIG. 2. During the fully closed interval 64 of the normally open contact, these pulses 14 are conducted in their entirety to line A, as represented at 72′, but during the interruption in conduction represented at 65 the pulses are interrupted as illustrated at 73. Following this interruption interval $T_2$, the pulses from $I_1$ are again delivered to line A as represented at 72″, until ultimate return of the key and switch to their normal condition, in which pulses 71 from line $I_n$ again resume in line A.

When the first pulse 72 from line $I_1$ reaches line A, this pulse is conducted through line 42 to AND circuit 26, whose second input 25 is energized by inverter 24, since the pulse 72 occurs at a time between two of the pulses 15 on line 23. Thus, the out of phase relationship of the signals on lines $I_1$ and $I_n$ (see broken line 74 in FIG. 2) causes AND gate 26 to produce an output, acting to set the flip-flop $FF_1$, and produce an output or high condition as represented at 75 in the output line 76 from the flip-flop. At the same time, the fact that the signals now being supplied through line 38 to AND gate 22 are out of phase with the other pulses being supplied to that gate prevents the delivery of a reset signal to flip-flop $FF_1$ through line 46.

At the time of initiation of the output signal in line 76 from flip-flop $FF_1$, line 55 is in a high or energized state, and as a result the two inputs to gate 46 actuate that gate to commence a pulse in output line $C_1$, as represented at 77 in FIG. 2. Also, the signal in line 76 is delivered through one of the lines 50 to OR circuit 51, to feed into shift register SR an input pulse, which is progressively shifted through that register and appears at its output 53 after a predetermined delay interval $T_4$, with the result that the output 55 from inverter 54 is terminated or goes low, to turn off the AND gate 46 and block transmission of a further signal to line $C_1$, thereby terminating the pulse 79 in line $C_1$ at 80. A precisely shaped square wave output pulse of accurately predetermined duration and synchronized timed relation with respect to the input pulses and clock pulses is thus delivered to line $C_1$.

When the interval $T_2$ of FIG. 2 is reached, the pulses in line A to AND gate 26 are interrupted, but this does not cause resetting of flip-flop $FF_1$, and consequently the output from that flip-flop continues as represented at 81 in FIG. 2. Since the flip-flop is not reset, this flip-flop and shift register SR can not act to form another pulse in line $C_1$ and therefore only a single pulse is formed upon each actuation of the flip-flop. Not until the movable contact 16 of switch $S_1$ (or any other actuated switch) is returned fully to the normal position of engagement with normally closed stationary contact 19 can the flip-flop be reset. When the actuated switch returns to its normal condition, and all of the switches are simultaneously in their condition of engagement with normally closed contacts 19, simultaneous input pulses are again supplied to all of the inputs to gate 22, to reset whichever of the flip-flops $FF_1$, $FF_2$, $FF_3$ or $FF_4$ has been actuated. Resetting of this flip-flop terminates the signal in the corresponding line 50, and introduces a low signal to the input to shift register SR, resulting in a high output in line 55 to return the entire circuit to its original condition. This resetting of the flip-flops and shift register is thus necessary to condition the apparatus for formation of a next successive output pulse in one of the lines $C_1$, $C_2$, $C_3$ or $C_4$ upon the next actuation of one of the switches.

While a cycle of operation of the circuitry has been described only in conjunction with actuation of one of the various switches, it will of course be apparent that operation of any the other switches acts similarly to set one of the flip-flops $FF_1$, $FF_2$, $FF_3$ or $FF_4$, and produce a shaped, timed and synchronized output pulse such as that shown at 79 in FIG. 2 on a corresponding one of the lines $C_1$, $C_2$, $C_3$ and $C_4$. The input circuit 10 of the remainder of the computer apparatus receives these signals, scans and examines them with relation to the timming of the inputs in lines $I_1$, $I_2$, etc., and makes a determination as to which of the switches has been actuated. The data thus supplied may then be coded to BCD form, and any commands be appropriately channeled for producing a desired calculating or data storing operation or the like, as is conventional in computer circuitry.

While a certain specific embodiment of the present invention has been disclosed as typical, the invention is of course not limited to this particular form, but rather is applicable broadly to all such variations as fall within the scope of the appended claims.

I claim:

1. Apparatus comprising:
   a plurality of principal input lines;
   additional input line means;
   a plurality of output lines;
   pulse supply means for delivering out-of-phase streams of timed input pulses to said principal input lines, and for delivering timed additional input pulses to said additional input line means in out-of-phase relation with respect to the pulses in said principal input lines;
   an array of switches for controlling the delivery of output signals to said output lines and each having first and second contact means responsive to actuation of the corresponding switch to first and second positions respectively;
   said first contact means of said switches being adapted to receive and control transmission of said additional pulses from said additional input line means;
   said second contact means of said switches being connected to said principal input lines to receive, and control transmission of, pulses therefrom;
   circuits controlled by pulses transmitted from said principal input lines through said second contact means, and operable in response to movement of an individual one of said switches from said first position thereof to its second position to deliver an output signal to a corresponding one of said output lines, and
   means controlled by said additional pulses transmitted from said additional input line means through said first contact means of said switches, and operable only when all of said switches are simultaneously in said first position to condition said apparatus for delivery of a next successive output signal to one of said output lines, and thereby preventing delivery of such a next successive signal until any previously actuated switch has returned to said first position thereof.

2. Apparatus as recited in claim 1, in which each of said principal input lines is connected to said second contact means of a series of said switches which control delivery of output signals to different ones of said output lines respectively.

3. Apparatus as recited in claim 1, in which said pulses delivered by said pulse supply means to said principal input lines and said additional input line means, though out-of-phase, are of a common frequency.

4. Apparatus as recited in claim 1, in which said last recited means include a circuit connecting a plurality of said first contact means of different ones of said switches, whose second contact means are connected to different ones of said principal input lines, in a series circuit which must be closed to condition said apparatus for delivery of a next successive output signal to one of said output lines.

5. Apparatus as recited in claim 1, in which said circuits include a plurality of gates each connected to at least one of said switches and said additional input line means, and responsive to simultaneous reception of a pulse from one of said principal lines and absence of a pulse from said out-of-phase additional input line means to cause production of an output signal.

6. Apparatus as recited in claim 1, in which each of said circuits includes a two stable state unit operable when actuated from a first state to a second state to deliver an output signal to one of said output lines, and means responsive to said input pulses from one of said principal input lines to actuate said unit to said second state thereof in response to actuation of one of said switches to its said second position.

7. Apparatus as recited in claim 1, in which said circuits include a plurality of two stable state units actuable from a first state to a second state upon movement of said switches to said second positions thereof, said last recited means of claim 1 including means operable by said additional pulses from said additional input line means to reset said units to said first states thereof upon return of all said switches to said first position.

8. Apparatus as recited in claim 1, in which said circuits include a plurality of two stable state units each operable upon actuation from a first state to a second state to cause initiation of an output signal in one of said output lines, means for actuating said units to said second states in response to actuation of said switches to said second positions thereof, and time delay means responsive to actuation of each of said units and operable to terminate said output signals after a predetermined interval following their initiation.

9. Apparatus as recited in claim 1, in which said circuits include a plurality of two stable state units operable upon actuation between first and second states to cause initiation of output signals in said output lines respectively, means for actuating said units to said second states in response to actuation of said switches to said second positions thereof, and a shift register energized by actuation of any of said units to said second state and operable after a predetermined timed interval to terminate an output signal.

10. Apparatus as recited in claim 1, in which said last mentioned means include means forming a plurality of series circuits from said additional input line means through different groups respectively of said switches when the switches are in said first position thereof, and gate means having inputs from said series circuits and operable to prevent initiation of a next successive output signal unless all of said switches are in said first positions thereof.

11. Apparatus as recited in claim 10, in which said gate means has a further input from said additional input line means and bypassing all of said switches and which must be energized simultaneously with said previously mentioned inputs of the gate means to actuate said gate means for enabling initiation of a next successive output signal.

12. Apparatus as recited in claim 11, in which said circuits include a plurality of two stable state units each actuable from a first state to a second state in response to actuation of any of a group of associated ones of said switches to said second position thereof, and operable to produce an output signal in response to actuation of the unit of said second state, said gate means being operable to reset said units to said first state thereof, in response to actuation of all of said switches to said first positions thereof.

13. Apparatus as recited in claim 12, including time delay means operable through a single cycle to produce only a single output signal upon each actuation of one of said units to its second state.

14. Apparatus as recited in claim 13, in which said circuits include additional gates for delivering actuating signals to said units to actuate them to said second states thereof, each of said additional gates having a first input to which a signal is supplied when any of an associated group of said switches is actuated to said second position thereof, and having a second input and an inverter connected thereto which is energized by pulses from said additional input line means.

* * * * *